(12) United States Patent
Liu et al.

(10) Patent No.: US 7,799,628 B2
(45) Date of Patent: Sep. 21, 2010

(54) ADVANCED METAL GATE METHOD AND DEVICE

(75) Inventors: Chung-Shi Liu, Shin-Chu (TW); Hsiang-Yi Wang, Hsinchu (TW); Cheng-Tung Lin, Hsinchu County (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/354,558

(22) Filed: Jan. 15, 2009

(65) Prior Publication Data
US 2010/0084718 A1    Apr. 8, 2010

Related U.S. Application Data

(60) Provisional application No. 61/102,978, filed on Oct. 6, 2008.

(51) Int. Cl.
*H01L 21/8238* (2006.01)

(52) U.S. Cl. .................. 438/199; 438/197; 438/663; 438/688; 438/769; 257/E21.006; 257/E21.17; 257/E21.077; 257/E21.259; 257/E21.267; 257/E21.304; 257/E21.32; 257/E21.593; 257/E21.632

(58) Field of Classification Search .......... 438/197, 438/199, 311, 623, 649.651, 679, 680, 688, 438/622, 700, 769, 733, 663; 257/E21.006, 257/17, 77, 259, 267, 304, 32, 593, 632
See application file for complete search history.

(56) References Cited

U.S. PATENT DOCUMENTS

| | | | |
|---|---|---|---|
| 6,750,519 B2 | 6/2004 | Lin et al. | |
| 6,831,343 B2 | 12/2004 | Hu | |
| 7,005,716 B2 | 2/2006 | Lin et al. | |
| 7,029,967 B2 * | 4/2006 | Zhao et al. | 438/199 |
| 7,033,888 B2 | 4/2006 | Pan et al. | |
| 7,368,796 B2 | 5/2008 | Hu | |
| 7,465,999 B2 * | 12/2008 | Wang et al. | 257/407 |
| 7,563,726 B2 * | 7/2009 | Cho et al. | 438/769 |

* cited by examiner

*Primary Examiner*—David Nhu
(74) *Attorney, Agent, or Firm*—Haynes and Boone, LLP

(57) ABSTRACT

The present disclosure provides a method of fabricating a semiconductor device that includes forming a high-k dielectric over a substrate, forming a first metal layer over the high-k dielectric, forming a second metal layer over the first metal layer, forming a first silicon layer over the second metal layer, implanting a plurality of ions into the first silicon layer and the second metal layer overlying a first region of the substrate, forming a second silicon layer over the first silicon layer, patterning a first gate structure over the first region and a second gate structure over a second region, performing an annealing process that causes the second metal layer to react with the first silicon layer to form a silicide layer in the first and second gate structures, respectively, and driving the ions toward an interface of the first metal layer and the high-k dielectric in the first gate structure.

20 Claims, 7 Drawing Sheets

ADVANCED METAL GATE METHOD AND DEVICE

PRIORITY DATA

This application claims priority to Provisional Application Ser. No. 61/102,978, filed on Oct. 6, 2008, entitled "ADVANCED METAL GATE PROCESS," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. There has been a desire to fabricate these devices with a metal material for the gate electrode and a high-k dielectric for the gate dielectric. However, an n-type MOS device (NMOS) and a p-type MOS device (PMOS) require different work functions for their respective gate electrode. Several approaches have been implemented to achieve N and P work functions, simultaneously, for the metal gates. One approach uses multiple metal and/or cap layers for the gate stack to achieve both N and P work functions. Although this approach has been satisfactory for its intended purpose, it has not been satisfactory in all respects. For example, the approach increases the complexity of the gate stack in the NMOS and PMOS devices, and thus increases the difficulty of patterning the gate stack.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
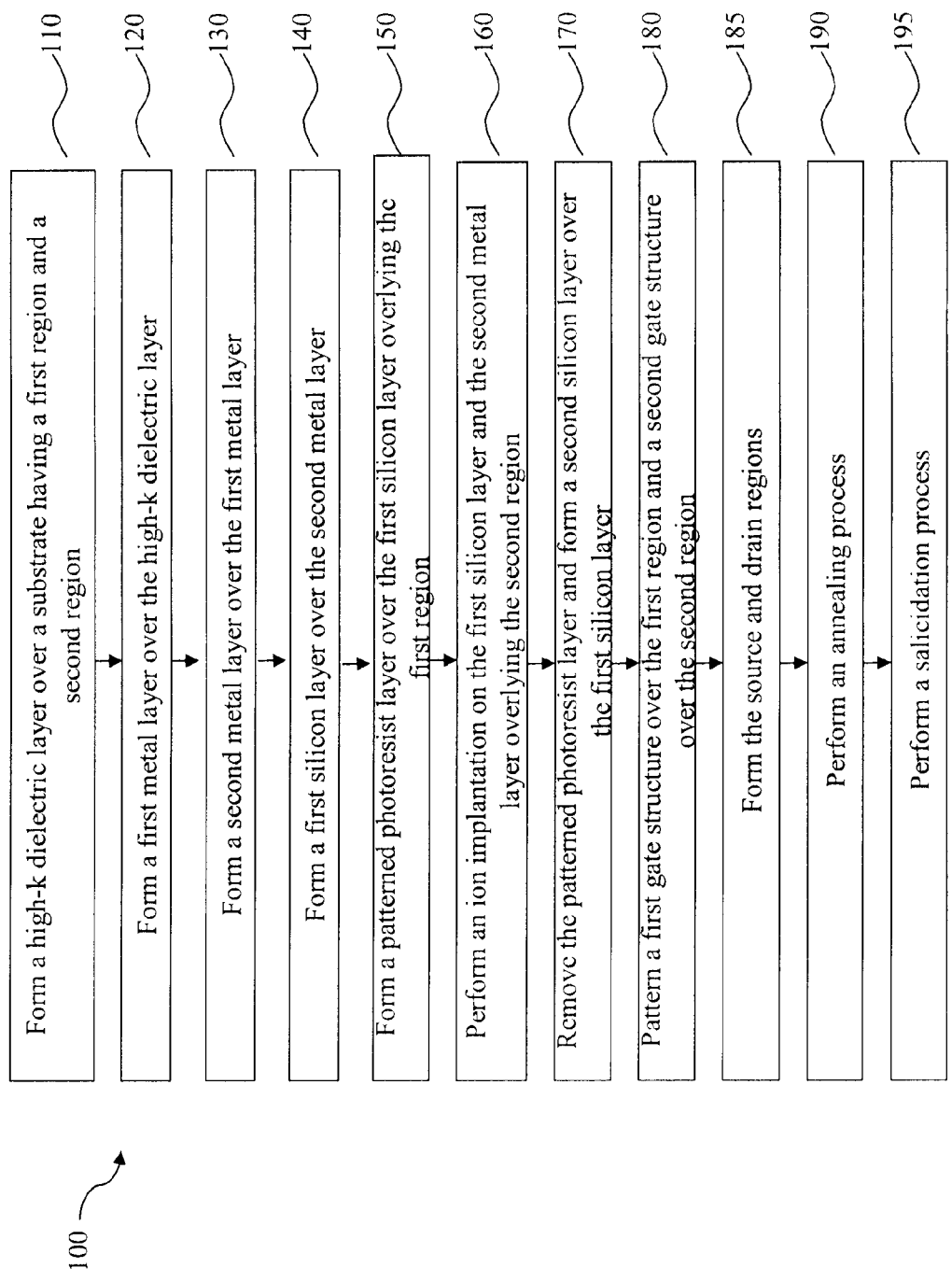
FIG. 1 is a flowchart illustrating a method for fabricating a semiconductor device according to various aspects of the present disclosure.

Illustrated in FIG. 1 is a flowchart of a method 100 for fabricating a semiconductor device with metal gates according to various aspects of the present disclosure. FIGS. 2A to 2F illustrate cross-sectional views of one embodiment of a semiconductor device 200 at various stages of fabrication according to the method 100 of FIG. 1. It is understood that FIGS. 2A to 2F have been simplified for a better understanding of the inventive concepts of the present disclosure. The semiconductor device 200 may be an integrated circuit, or portion thereof, that may comprise static random access memory (SRAM) and/or other logic circuits, passive components such as resistors, capacitors, and inductors, and active components such as P-channel field effect transistors (pFET), N-channel FET (nFET), metal-oxide semiconductor field effect transistors (MOSFET), or complementary metal-oxide semiconductor (CMOS) transistors. It should be noted that some features of the semiconductor device 200 may be fabricated with a CMOS process flow. Accordingly, it is understood that additional processes may be provided before, during, and after the method 100 of FIG. 1, and that some other processes may only be briefly described herein.

Figure 2A:
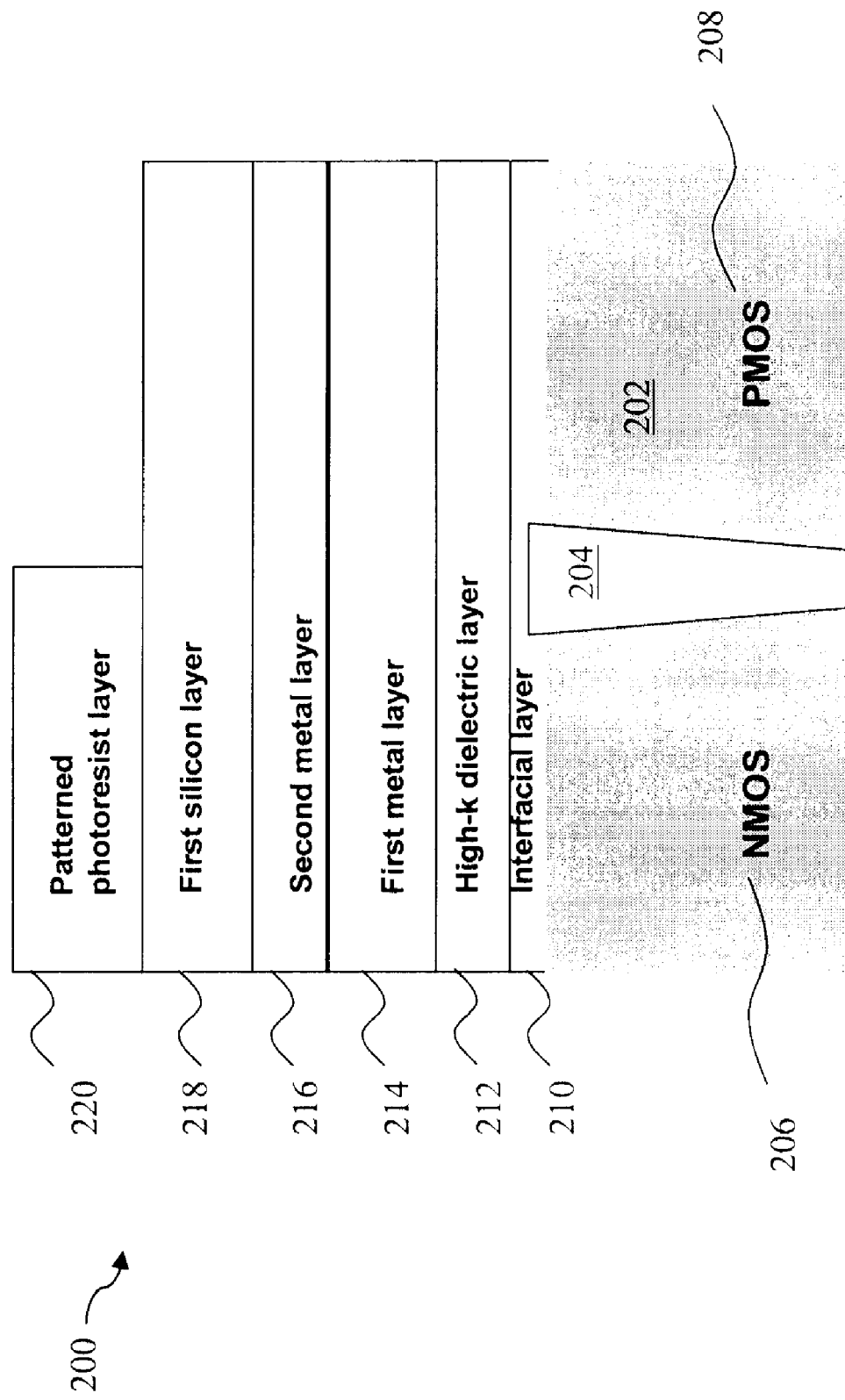
FIGS. 2A to 2F are cross-sectional views of a semiconductor device at various stages of fabrication according to the method of FIG. 1.

Referring to FIG. 1, the method 100 begins with block 110 in which a high-k dielectric material may be formed over a semiconductor substrate having a first region and a second region. Referring also to FIG. 2A, the semiconductor device 200 includes a semiconductor substrate 202 such as a silicon substrate. The substrate 202 may include various doping configurations depending on design requirements as is known in the art. The substrate 202 may also include other elementary semiconductors such as germanium and diamond. Alternatively, the substrate 202 may include a compound semiconductor and/or an alloy semiconductor. Further, the substrate 202 may optionally include an epitaxial layer (epi layer), may be strained for performance enhancement, and may include a silicon-on-insulator (SOI) structure.

The semiconductor device 200 may further include an isolation structure 204 such as a shallow trench isolation (STI) feature formed in the substrate 202 for isolating active regions 206 and 208 in the substrate. The isolation structure 204 may be formed of silicon oxide, silicon nitride, silicon oxynitride, fluoride-doped silicate (FSG), and/or a low-k dielectric material known in the art. The active region 206 may be configured for an N-type metal-oxide-semiconductor transistor device (referred to as NMOS), and the active region 208 may be configured for a P-type MOS transistor device (referred to as PMOS).

The semiconductor device 200 may further include an interfacial layer 210 formed over the substrate 202. The interfacial layer 210 may include a silicon oxide layer having a thickness ranging from about 5 to 10 angstroms (A). The interfacial layer 210 may be formed by atomic layer deposition (ALD) or other suitable technique.

The semiconductor device 200 further includes a high-k dielectric layer 212 formed over the interfacial layer 210. The high-k dielectric layer 212 may include hafnium oxide (HfO$_2$). Alternatively, the high-k dielectric layer 212 may optionally include other high-k dielectric materials such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. The high-k dielectric layer 212 may be formed by ALD or other suitable technique. The high-k dielectric layer 212 may have a thickness ranging from 10 to about 30 angstroms (A).

The method 100 continues with block 120 in which a first metal layer may be formed over the high-k dielectric layer. The semiconductor device 200 further includes a metal layer 214 formed over the high-k dielectric layer 212. The metal layer 214 may be formed by ALD, physical vapor deposition (PVD or sputtering), chemical vapor deposition (CVD), or other suitable process. In the present embodiment, the metal layer 214 may include titanium nitride (TiN). Alternatively, the metal layer 214 may optionally include tantalum nitride (TaN), ZrN, HfN, VN, NbN, CrN, MoN, WN, or combinations thereof. The metal layer 214 includes a thickness ranging from about 20 to about 200 angstroms (A), preferably about 50 A.

Referring again to FIG. 1, the method 100 continues with block 130 in which a second metal layer may be formed over the first metal layer. The semiconductor device 200 further includes a metal layer 216 formed over the metal layer 214. In the present embodiment, the metal layer 216 may include Ti. Alternatively, the metal layer 216 may optionally include tungsten (W), Ta, Cr, V, Nb, Zr, Hf, Mo, Ni, Co, or combinations thereof. The metal layer 216 may be formed by various deposition techniques such as PVD, CVD, ALD, plating, or other suitable techniques. In the present embodiment, the metal layer 216 includes a thickness ranging from about 10 to about 100 angstroms (A), preferably about 30 A.

The method 100 continues with block 140 in which a first silicon layer is formed over the second metal layer. The semiconductor device 200 further includes a silicon layer 218 formed over the metal layer 216. The silicon layer 218 may be formed of amorphous silicon or polycrystalline silicon (referred to as polysilicon). The silicon layer 218 may be formed using methods such as CVD. For example, silane (SiH$_4$) may be used as a chemical gas in the CVD process to form the silicon layer 218. In the present embodiment, the silicon layer 218 may have a thickness ranging from about 50 to about 1000 angstroms (A), preferably about 100 A.

The method 100 continues with block 150 in which a patterned photoresist layer may be formed over the first silicon layer overlying the first region. A patterned photoresist layer 220 may be formed over the first silicon layer 218 in the NMOS device 206 side. The patterned photoresist layer 220 may be formed by photolithography, immersion lithography, ion-beam writing, or other suitable process. For example, the photolithography process may include spin coating, soft-baking, exposure, post-baking, developing, rinsing, drying, and other suitable process.

Figure 2B:
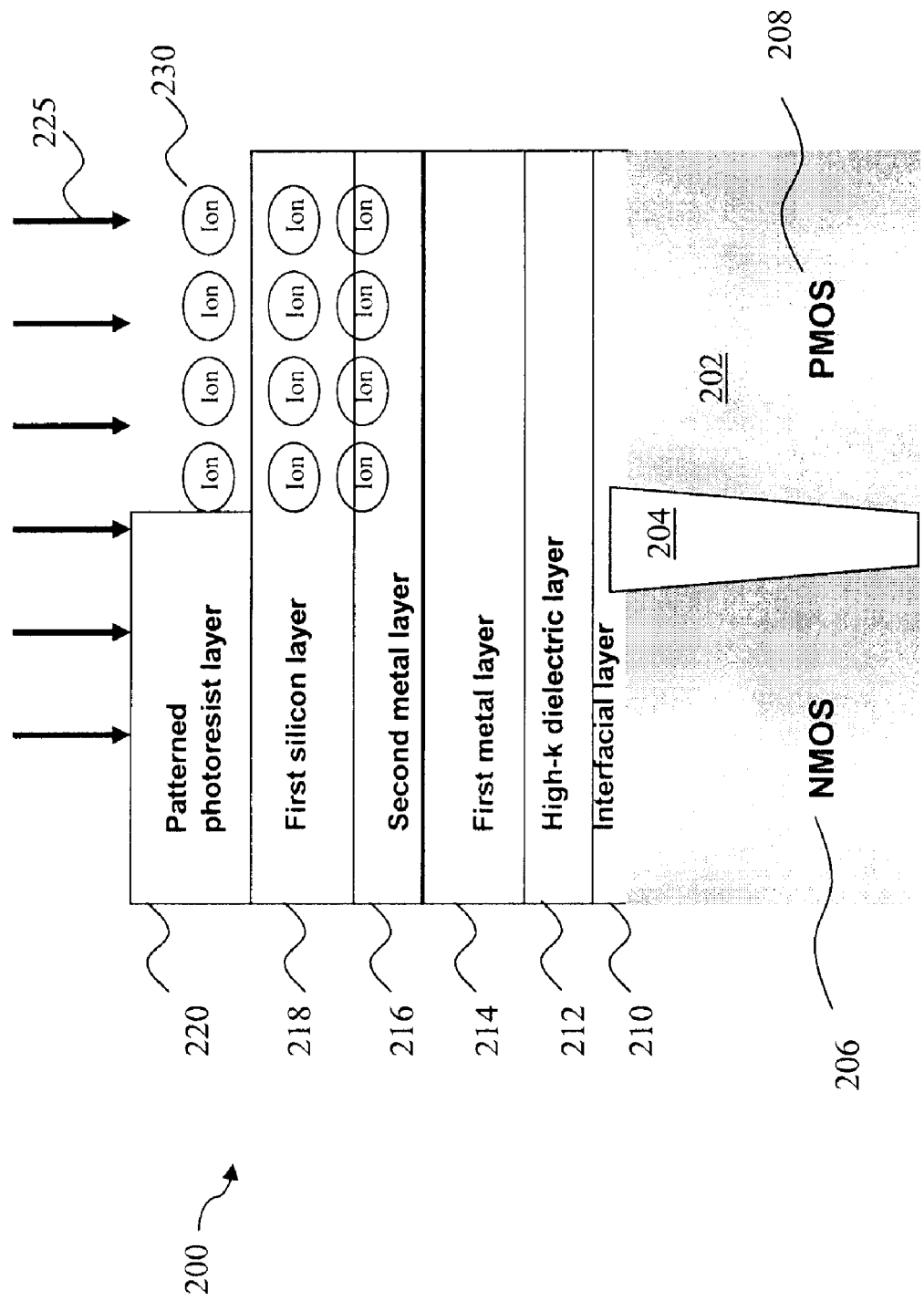
Figure 2C:
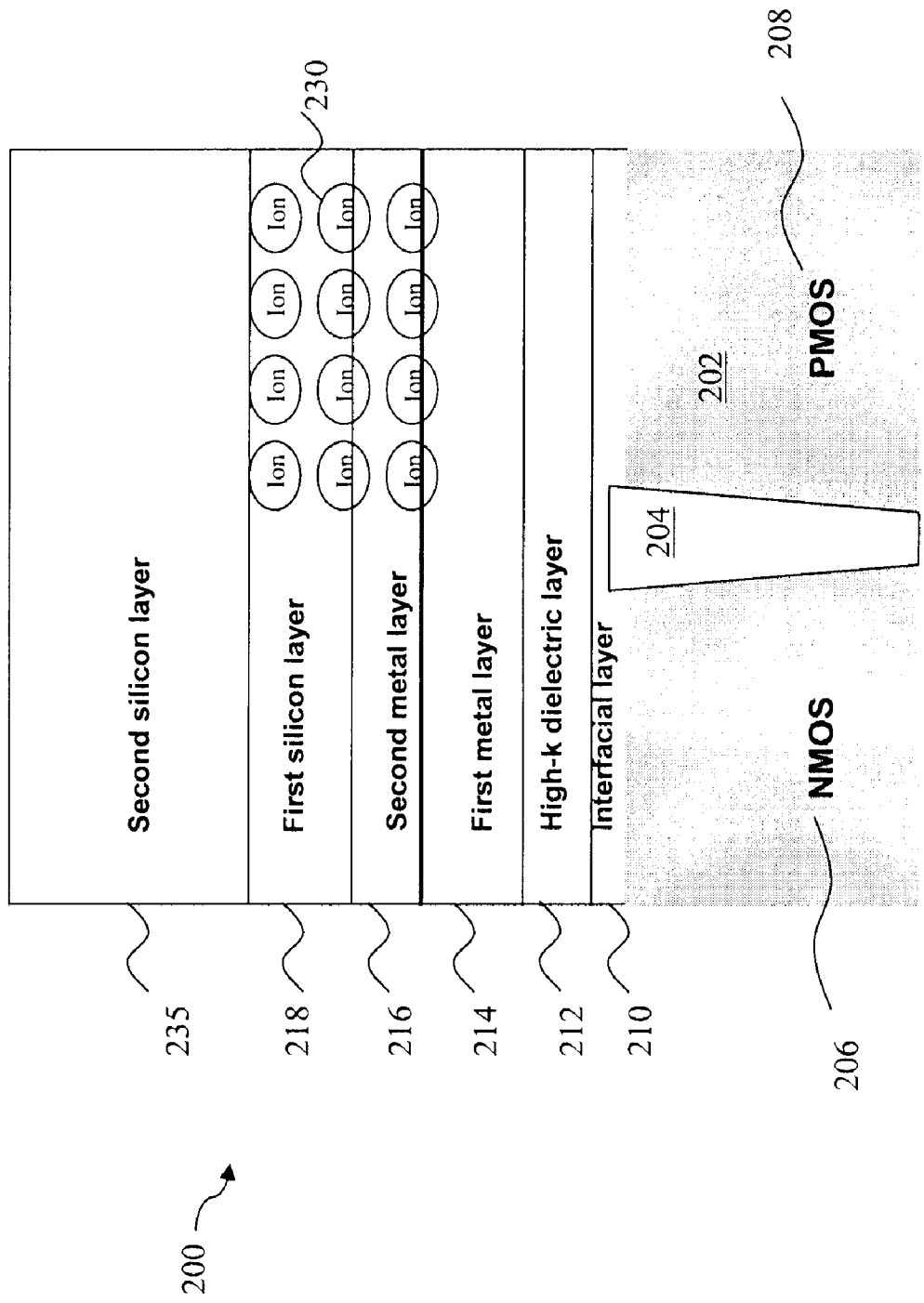

The method 100 continues with block 160 in which an ion implantation process may be performed on the first silicon layer and the second metal layer overlying the second region. Referring also to FIG. 2B, the semiconductor device 200 may be subjected to a ion implantation process 225, in which a plurality of ions 230 may be implanted into a portion of the silicon layer 218 and metal layer 216 that are uncovered by the patterned photoresist layer 220. That is, the ions 230 are implanted in the silicon layer 218 and metal layer 216 of the PMOS device side. The plurality of ions 230 may be effectively distributed into the silicon layer 218 and the metal layer 216 by controlling a dose level (or dosage) of the ions and an implantation energy. The distribution of the ions may be configured so that the greatest concentration of the ions is located proximate to an interface between the silicon layer 218 and the metal layer 216. In the present embodiment, the dopant may include aluminum (Al), the implantation energy is about 5 keV, and the dose level is about $2 \times 10^{15}$ atoms/cm$^2$. It should be noted that some ions may penetrate but are prevented from penetrating The method 100 continues with block 170 in which the patterned photoresist layer may be removed and a second silicon layer may be formed over the first silicon layer. Referring also to FIG. 2C, the photoresist layer 220 may be removed by a stripping or ashing process. A silicon layer 235 may then be formed over the silicon layer 218 by CVD or other suitable process. The silicon layer 235 may be formed of amorphous silicon or polysilicon. In the present embodiment, the silicon layer 235 may have a thickness ranging from about 500 to about 1500 angstroms (A), preferably about 900 angstroms (A).

Figure 2D:
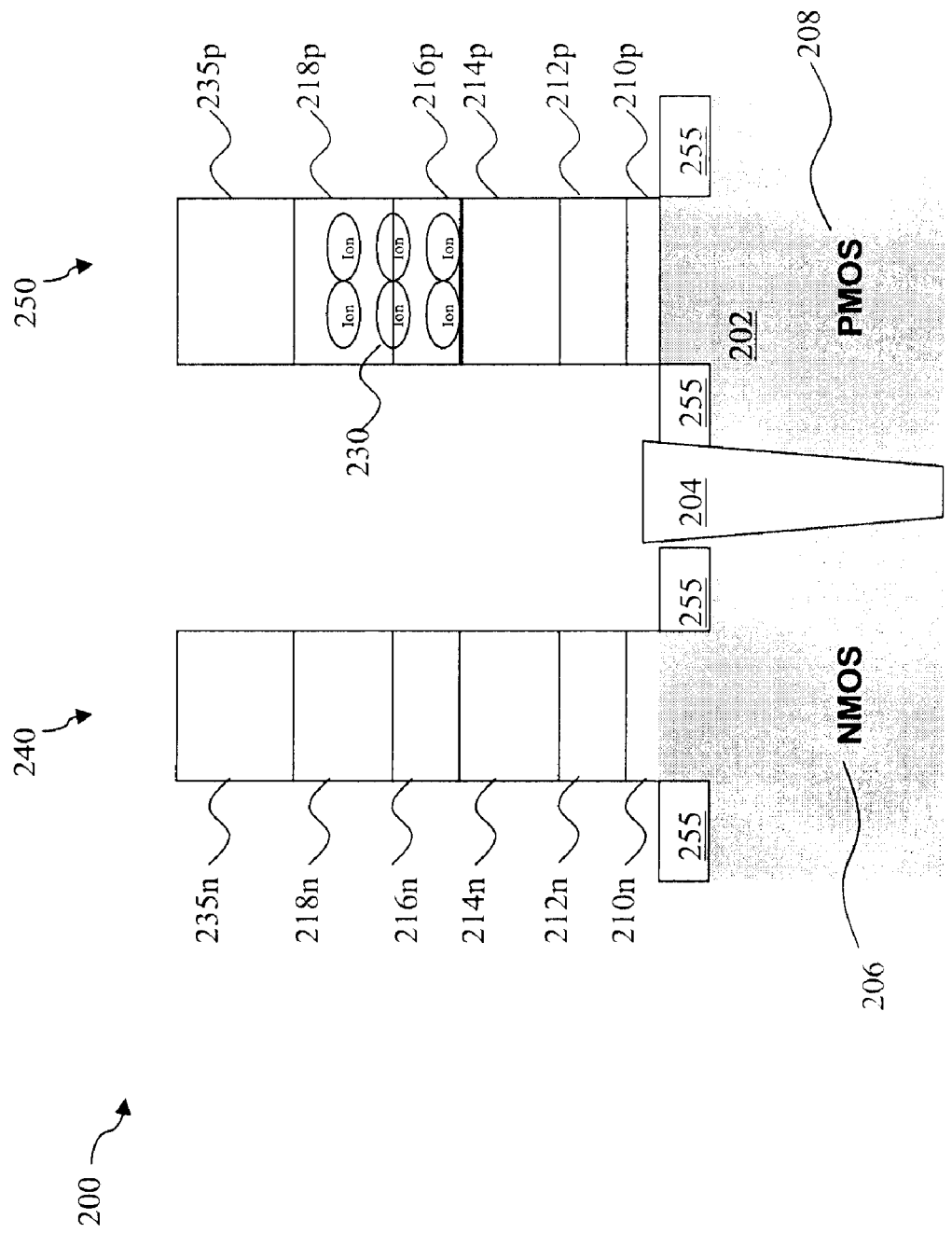

The method 100 continues with block 180 in which a first gate structure may be formed in the first region and a second gate structure may be formed in the second region. Referring also to FIG. 2D, a gate structure 240 may be formed in the NMOS device 206 and a gate structure 250 may be formed in the PMOS device 208. For example, a hard mask layer may be formed over the silicon layer 235. The hard mask layer may include silicon oxide, silicon nitride, silicon oxynitride, and/or other suitable materials. The hard mask layer may be formed using methods such as CVD, PVD, or ALD. Additionally, an anti-reflective coating (ARC) layer or bottom anti-reflective coating (BARC) layer may be formed on the hard mask layer to enhance a subsequent patterning process as is known in the art.

A patterned photoresist layer may be formed on the hard mask layer. The patterned photoresist layer may include a gate pattern for the pMOS device 206 and a gate pattern for the nMOS device 208. The gate patterns may be formed by photolithography, immersion lithography, ion-beam writing, or other suitable process. The hard mask layer may be patterned by a dry or wet etching process using the patterned photoresist as a mask, and the patterned hard mask layer may be used to pattern the gate structure 240 for the NMOS device 206 and the gate structure 250 for the PMOS device. The gate structures 240, 250 may be formed by a dry etching or wet etching or combination dry and wet etching process (e.g., gate etching or patterning). For example, the dry etching process may use a fluorine-containing plasma (e.g., etch gas includes CF$_4$). Alternatively, the etching process may include multiple etching steps to etch the various gate material layers. The patterned photoresist layer may be removed by a stripping or ashing process.

In the present embodiment, the gate structure 240 of the NMOS device 206 may include an interfacial layer 210n, a high-k dielectric layer 212n, a metal layer 214n, a metal layer 216n, a silicon layer 218n, and a silicon layer 235n. The gate structure 250 of the PMOS device 208 may include an interfacial layer 210p, a high-k dielectric layer 212p, a metal layer 214p, a metal layer 216p, a silicon layer 218p, and a silicon layer 235p. It should be noted that the ions 230 in the gate structure 250 of the PMOS device 208 are not present in the gate structure 240 of the NMOS device 206.

The method 100 continues with block 185 in which source regions and drain regions may be formed in the substrate. The semiconductor device 200 may further include source/drain (S/D) regions 255 formed in the substrate 202 on either side of the gate structures 240 and 250, respectively. The S/D regions 255 may include lightly doped source/drain (referred to as LDD) regions formed by an ion implantation or diffusion process as is known in the art. For example, N-type dopants such as phosphorus or arsenic may be implanted in the NMOS device 206 side and P-type dopants such as boron may be implanted in the PMOS device 208 side. Sidewall or gate spacers may then be formed on the sides of the gate structures 240 and 250 by a deposition and etching process (e.g., anisotropic etching process) as is known in the art. The gate spacers may include a suitable dielectric material such as silicon nitride, silicon oxide, silicon carbide, silicon oxynitride, or combinations thereof. The S/D regions 255 may include heavy doped source/drain regions formed in the substrate 202 on either side of the gate structures 240 and 250 using ion implantation or diffusion with suitable N-type and P-type dopants in the NMOS device 206 and PMOS device 208, respectively.

Figure 2E:
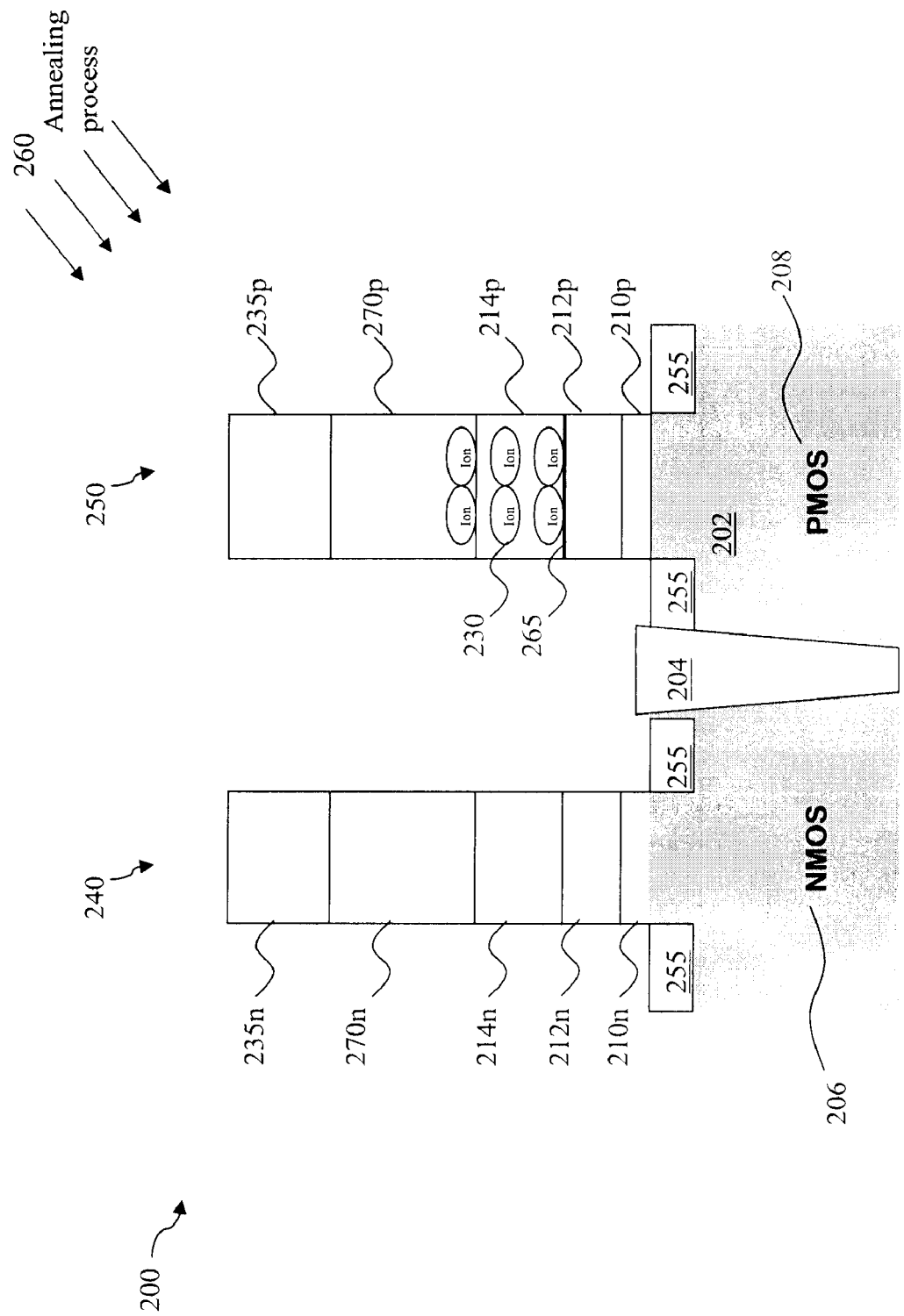

The method 100 continues with block 190 in which an annealing process may be performed. Referring also to FIG. 2E, an annealing process 260 may be performed to simultaneously activate the S/D regions 255 and drive the ions 230 toward an interface 265 between the metal layer 214p and the high-k dielectric layer 212p in the gate structure 250. The annealing process 260 may be performed at a temperature ranging from about 950 to about 1200 degree C. The annealing process 260 may also be performed at a time period ranging from 0.5 to 10 seconds. The annealing process 260 may include a rapid thermal annealing process (RTA) or a laser spike annealing process. In the present embodiment, the annealing process 260 may include a temperature at about 1035 degree C. and a time interval of about 1.5 seconds. The annealing process 260 may cause the metal layers 216n, 216p to react with the silicon layers 218n, 218p to form silicide layers 270n, 270p, respectively. In the present embodiment, the Ti layer may react with silicon layer to form various configurations of titanium silicide TiSi (TiSi$_x$, where x is the ratio of silicon atoms to titanium atoms). In some other embodiments, the W layer may react with the silicon layer to form various configurations of tungsten silicide WSi (WSi$_x$, where x is the ratio of silicon atoms to tungsten atoms). It should be noted that the metal layers 214n, 214p may function as a buffer layer and may prevent gate leakage that may be induced by silicide penetration.

The thickness of the silicide layers 270n, 270p may be controlled by various factors such as the initial thickness of the metal layer 216n, 216p, the initial thickness of the silicon layer 218n, 218p as well as the annealing time. In the present embodiment, the thickness of the TiSi$_x$ formed after the annealing process is controlled to have a range of 20 to 300 angstroms, preferably 50 angstroms. Another feature of the present embodiment is that the during the formation of the silicide layer 270n in the gate structure 250, a silicide snowplow effect drives the ions 230 toward the interface 265 of the high-k dielectric layer 212p and the first metal layer 214p. Accordingly, an effective work function may be adjusted (e.g., increased) for the gate structure 250 so as to properly perform in the PMOS device 208, and thus achieves a desired target threshold voltage for the PMOS device. Further, it has been observed that the formation of the TiSi$_x$ layer in the gate structure 240 also improves a threshold voltage of the NMOS device 206. Moreover, similar effects are also applicable with the silicide formation in a gate structure including TaN/WSi$_x$ of the NMOS and PMOS devices, respectively.

It should be noted that the snowplow effect provides a less severe approach to incorporate various concentrations of ions proximate to the interface 265 between the metal layer 214p and the high-k dielectric layer 212p to adjust the effective work function as compared to directly implanting ions at the interface 265 by an ion implantation process. Accordingly, the risk of ions penetrating and damaging the high-k dielectric material is reduced, and thus device performance is improved. Another benefit of the present embodiment is that the silicide layers 270n, 270p may prevent formation of an interlayer oxide between a metal/polysilicon configuration thereby inducing a ring oscillator delay in some applications.

Figure 2F:
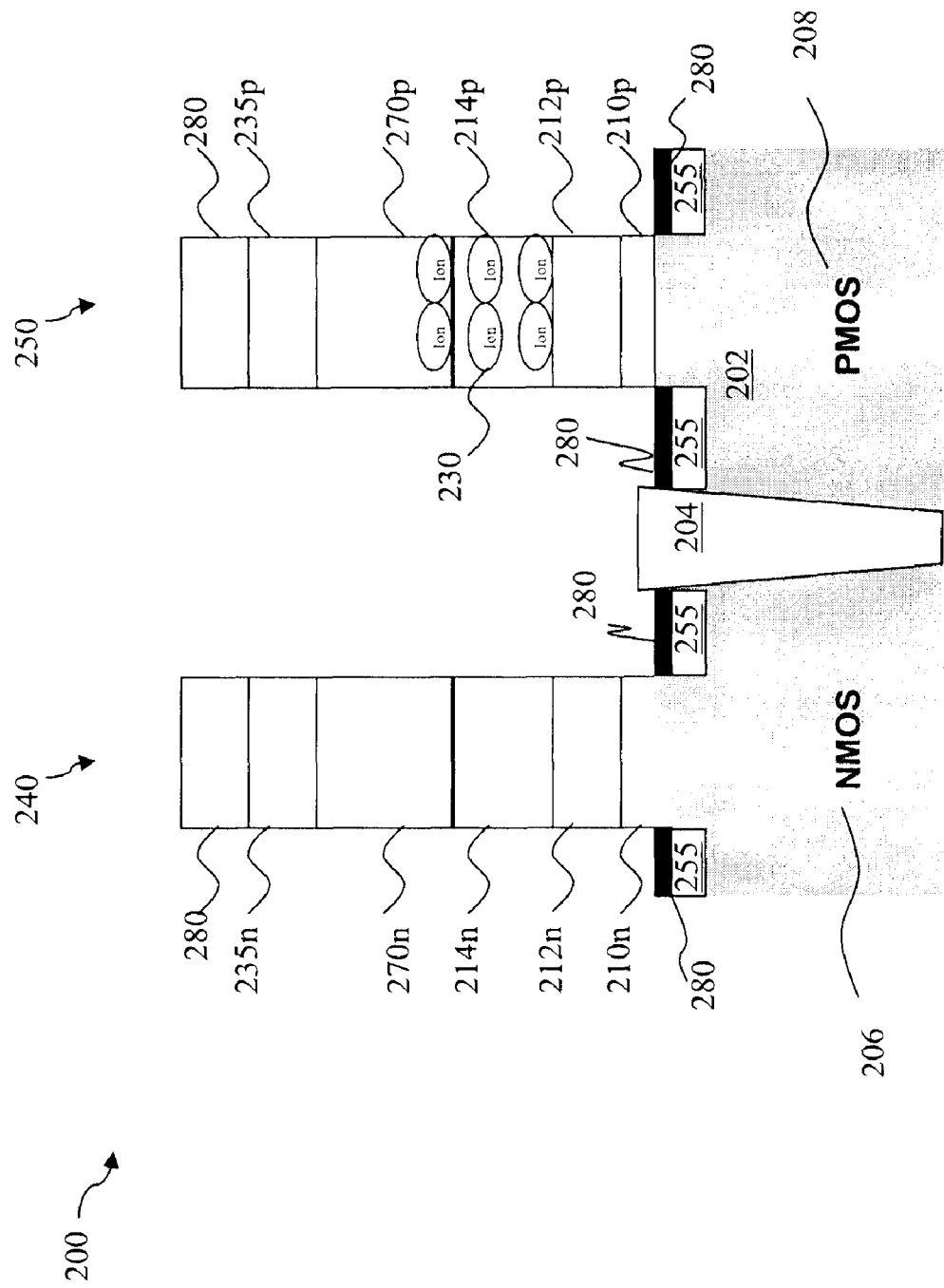

The method 100 may continue with block 195 in which a salicidation process may be performed. Referring also to FIG. 2F, a salicidation process (or self-aligned silicidation process) may be performed to form contact features 280 on the S/D regions 255 and the gate structures 240, 250. For example, the salicidation process may include forming a metal material over the substrate 202 including next to silicon structure of the S/D regions 255 and the silicon layers 235n, 235p of the gate structures 240, 250, respectively, and then raising the temperature to anneal and cause a reaction between the underlying silicon and metal material to form a silicide feature, and lastly removing the un-reacted metal material away. The contact features 280 may include nickel silicide, cobalt silicide, tungsten silicide, tantalum silicide, titanium silicide, platinum silicide, erbium silicide, palladium silicide, or combinations thereof. A benefit of forming the contact features 280 is that contact resistance is reduced. It should be noted that a portion of the silicon layers 235n, 235p may not react with the metal material during the salicidation process, and thus may remain in the gate structures 240, 250, respectively. As such, the silicon layers 235n, 235p may be doped (e.g., conductive) during formation of the silicon layer 235 or during formation of the S/D regions 255.

It is understood that the method 100 may continue with further CMOS processing flow to complete fabrication of the semiconductor device 200. For example, a contact etch stop layer (CESL) may be formed over the substrate 202. The contact etch stop layer (CESL) may be formed of silicon nitride, silicon oxynitride, and/or other suitable materials. The CESL composition may be selected based upon etching selectivity to one or more additional features of the semiconductor device 200. Further, the CESL may be configured as a tensile-CESL or a compressive-CESL depending on the transistor type.

A plurality of patterned dielectric layers and conductive layers are formed over the substrate 202 to form multilayer interconnects configured to couple the various doped regions, such as the S/D regions 255, and gate structures 240, 250. For example, an interlayer dielectric (ILD) and a multilayer interconnect (MLI) structure are formed in a configuration such that the ILD separates and isolates each from other of the MLI structure. In furtherance of the example, the MIL structure includes contacts, vias and metal lines formed on the substrate. In one example, the MIL structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof.

The copper interconnect may be formed by a technique including CVD, sputtering, plating, or other suitable processes.

The present embodiment using titanium for the metal layer 216 and titanium nitride for the metal layer 214 may also provide various other benefits in the semiconductor manufacturing process. One benefit may be that only one target—titanium—is needed to form the metal layers. Another benefit may be that both the titanium and the titanium nitride layers may be formed in-situ within one chamber. Still another benefit is that a gradient nitrogen concentration level may be tuned within the titanium layer. Yet another benefit is that after the formation of the titanium nitride layer, the shutter in the chamber does not need to be cleaned before the formation of the titanium layer.

In summary, the methods and devices disclosed provide a cost effective approach to fabricate high-k metal gate devices in a gate first process using a same metal layer and high-k dielectric layer for both NMOS and PMOS devices. The methods and devices disclosed herein take advantage of a snowplow effect during silicide formation to adjust the work function in one type of device by driving ions toward an interface between the metal and high-k dielectric layers. Accordingly, the risk of penetrating and damaging of the high-k dielectric layer is reduced as compared to directly implanting various concentrations of ions at the interface by an ion implantation process to adjust the work function. Further, the silicide formation may be performed concurrently with the annealing process that activates the S/D regions. Accordingly, the methods and devices disclosed herein may easily be integrated with current CMOS process flow and semiconductor processing equipment. Moreover, the methods disclosed herein implement materials and processes that are friendly and compatible with the CMOS process flow, and that are inexpensive to incorporate with the process flow.

Thus, provided is a method for fabricating a semiconductor device that includes forming a high-k dielectric layer over a semiconductor substrate, the semiconductor substrate having a first region and a second region, forming a first metal layer over the high-k dielectric layer, forming a second metal layer over the first metal layer, forming a first silicon layer over the second metal layer, implanting a plurality of ions into the first silicon layer and the second metal layer overlying the first region of the substrate, forming a second silicon layer over the first silicon layer, patterning a first gate structure over the first region and a second gate structure over the second region, the first and second gate structures each including the high-k dielectric layer, the first metal layer, the second metal layer, the first silicon layer, and the second silicon layer, and performing an annealing process that causes the second metal layer to react with the first silicon layer to form a silicide layer in the first and second gate structures, respectively. The formation of the silicide layer in the first gate structure drives the plurality of ions toward an interface of the first metal layer and the high-k dielectric layer in the first gate structure.

Also provided is a semiconductor device that includes a semiconductor substrate having first region and a second region, a first gate stack overlying the first region, the first gate stack including: a high-k dielectric layer formed over the substrate, a metal layer formed over the high-k dielectric layer; a first silicide layer formed over the metal layer; a doped silicon layer over the first silicide layer, and a plurality of ions located proximate to an interface of the metal layer and the high-k dielectric layer; and a source region and a drain region formed in the substrate on either side of the first gate stack. In some embodiments, the semiconductor device further includes a second gate stack located overlying the second region, the second gate stack including: a high-k dielectric layer formed over the substrate, a metal layer formed over the high-k dielectric layer, a first silicide layer formed over the metal layer, and a doped silicon layer formed over the first silicide layer, a source region and a drain region formed in the substrate on either side of the second gate stack, and an isolation structure formed in between the first region and the second region. The plurality of ions are not located in the second gate stack.

Further, a method for fabricating a semiconductor device is provided that includes forming a high-k dielectric layer over a semiconductor substrate, the semiconductor substrate having a first region and a second region, forming a first metal layer over the high-k dielectric layer, forming a second metal layer over the first metal layer, forming a first silicon layer over the second metal layer, forming a protection layer over the first silicon layer overlying the second region, implanting a plurality of dopants into the first silicon layer and the second metal layer overlying the first region, removing the protection layer, forming a first gate structure over the first region and a second gate structure over the second region, the first and second gate structures each including the high-k dielectric layer, the first metal layer, the second metal layer, and the first silicon layer, forming source regions and drain regions in the substrate, the source region and the drain region being formed on either side of the first and second gate structures, respectively, and performing an annealing process that activates the source and drain regions and that causes a reaction between the second metal layer and the first silicon layer that forms a first silicide layer in the first and second gate structures, respectively. Responsive to the formation of the first silicide layer in the first gate structure, the plurality of dopants are driven toward an interface of the first metal layer and the high-k dielectric layer in the first gate structure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device comprising:

forming a high-k dielectric layer over a semiconductor substrate, the semiconductor substrate having a first region and a second region;

forming a first metal layer over the high-k dielectric layer;

forming a second metal layer over the first metal layer;

forming a first silicon layer over the second metal layer;

implanting a plurality of ions into the first silicon layer and the second metal layer overlying the first region of the substrate;

forming a second silicon layer over the first silicon layer;

patterning a first gate structure over the first region and a second gate structure over the second region, the first and second gate structures each including the high-k dielectric layer, the first metal layer, the second metal layer, the first silicon layer, and the second silicon layer; and performing an annealing process that causes the second metal layer to react with the first silicon layer to form a silicide layer in the first and second gate structures, respectively;

wherein forming the silicide layer in the first gate structure drives the plurality of ions toward an interface of the first metal layer and the high-k dielectric layer in the first gate structure.

2. The method of fabricating a semiconductor device according to claim 1, wherein the first metal layer includes TiN, TaN, ZrN, HfN, VN, NbN, CrN, MoN, or WN, and wherein the second metal layer includes Ti, W, Ta, Cr, V, Nb, Zr, Hf, Mo, Ni, or Co.

3. The method of fabricating a semiconductor device according to claim 2, wherein the first metal layer has a thickness of about 50 angstroms and wherein the second metal layer has a thickness of about 30 angstroms.

4. The method of fabricating a semiconductor device according to claim 1, wherein the first silicon layer has a thickness of about 100 angstroms, and wherein the second silicon layer has a thickness of about 900 angstroms.

5. The method of fabricating a semiconductor device according to claim 1, wherein the plurality of ions include Al.

6. The method of fabricating a semiconductor device according to claim 1, wherein implanting is carried out in a manner so that a plurality of aluminum ions are implanted with a dosage of about $2 \times 10^{15}$ atoms/cm$^2$ and an implantation energy of about 5 keV.

7. The method of fabricating a semiconductor device according to claim 1, wherein the annealing process includes a temperature ranging from about 950 to about 1200 degree C. and a time period ranging from about 0.5 to about 10 seconds.

8. The method of fabricating a semiconductor device according to claim 1, further comprising prior to implanting, forming a patterned photoresist layer on the first silicon layer overlying the second region, the patterned photoresist layer preventing the plurality of ions from being implanted into the first silicon layer overlying the second region.

9. A method of fabricating a semiconductor device comprising:
forming a high-k dielectric layer over a semiconductor substrate, the semiconductor substrate having a first region and a second region;
forming a first metal layer over the high-k dielectric layer;
forming a second metal layer over the first metal layer;
forming a first silicon layer over the second metal layer;
forming a protection layer over the first silicon layer overlying the second region;
implanting a plurality of dopants into the first silicon layer and the second metal layer overlying the first region,
removing the protection layer;
forming a first gate structure over the first region and a second gate structure over the second region, the first and second gate structures each including the high-k dielectric layer, the first metal layer, the second metal layer, and the first silicon layer;
forming source regions and drain regions in the semiconductor substrate, the source region and the drain region being formed on either side of the first and second gate structures, respectively; and
performing an annealing process that activates the source and drain regions and that causes a reaction between the second metal layer and the first silicon layer to form a first silicide layer in the first and second gate structures, respectively;
wherein responsive to forming the first silicide layer in the first gate structure, the plurality of dopants are driven toward an interface of the first metal layer and the high-k dielectric layer in the first gate structure.

10. The method of fabricating a semiconductor device according to claim 9, wherein the first metal layer includes TiN, TaN, ZrN, HfN, VN, NbN, CrN, MoN, or WN, and wherein the second metal layer includes Ti, W, Ta, Cr, V, Nb, Zr, Hf, Mo, Ni, or Co.

11. The method of fabricating a semiconductor device according to claim 9, further comprising after removing the protection layer and prior to forming the first and second gate structures, forming a second silicon layer over the first silicon layer;
wherein the first and second gate structures each further includes the second silicon layer.

12. The method of fabricating a semiconductor device according to claim 9, further comprising after performing the annealing process, performing a salicidation process that includes:
forming a third metal layer over the source regions, the drain regions, and the second silicon layer in the first and second gate structures, respectively;
performing another annealing process that causes the third metal layer to react with the source regions, the drain regions, and the second silicon layer in the first and second gate structures, respectively, thereby forming contact features for the source regions, contact features for the drain regions, and a second silicide layer in the first and second gate structures, respectively; and
removing an un-reacted third metal layer.

13. The method of fabricating a semiconductor device according to claim 9, wherein the plurality of dopants include Al.

14. The method of fabricating a semiconductor device according to claim 9, wherein implanting includes tuning an ion implantation energy and a dose level of the plurality of the dopants to effect a desired distribution of the plurality of dopants in the first silicon layer and the metal layer overlying the first region.

15. A method of fabricating a semiconductor device, comprising:
providing a substrate having first and second regions that are separated by an isolation structure; and
forming first and second gate structures over the first and second regions, respectively, the first and second gate structures having first and second high-k dielectric layers and first and second metal layers, respectively, the first high-k dielectric layer and the first metal layer forming a first interface, and the second high-k dielectric layer and the second metal layer forming a second interface;
wherein forming the first and second gate structures is carried out in a manner so that a plurality of dopant ions are disposed proximate to the first interface, and the second interface is substantially free of dopant ions.

16. The method of fabricating a semiconductor device according to claim 15, wherein forming the first and second gate structures includes:
forming the first and second high-k dielectric layers over the first and second regions, respectively;
forming the first and second metal layers over the first and second high-k dielectric layers, respectively;
forming third and fourth metal layers over the first and second metal layers, respectively;
forming first and second silicon layers over the third and fourth metal layers, respectively;

implanting the plurality of dopant ions into the first silicon layer and the third metal layer; and performing an annealing process on the first silicon layer and the third metal layer, the annealing process causing a reaction between the first silicon layer and the third metal layer in a manner that moves the plurality of dopant ions toward the first interface.

17. The method of fabricating a semiconductor device according to claim 16, wherein performing the annealing process is carried out in a manner so that a silicide material is formed over the first metal layer as a result of the reaction between the first silicon layer and the third metal layer, and wherein the silicide material facilitates the movement of the plurality of dopant ions toward the first interface.

18. The method of fabricating a semiconductor device according to claim 16, wherein implanting the plurality of dopant ions is carried out using a dosage of about $2 \times 10^{15}$ atoms/cm$^2$ and an implantation energy of about 5 keV, and wherein the performing the annealing process is carried out under temperatures ranging from about 950 degrees Celsius to about 1200 degrees Celsius for a duration ranging from about 0.5 seconds to about 10 seconds.

19. The method of fabricating a semiconductor device according to claim 16, wherein:
    forming the first and second metal layers is carried out so that the first and second metal layers each include one of TiN, TaN, ZrN, HfN, VN, NbN, CrN, MoN, and WN;
    forming the third and fourth metal layers is carried out so that the third and fourth metal layers each include one of Ti, W, Ta, Cr, V, Nb, Zr, Hf, Mo, Ni, and Co; and
    implanting is carried out so that the plurality of dopant ions include Al ions.

20. The method of fabricating a semiconductor device according to claim 15, further including:
    forming a first source region and a first drain region in the substrate, the first source region and the first drain region being disposed at either side of the first gate structure and being doped with a first dopant of a first type; and
    forming a second source region and a second drain region in the substrate, the second source region and the second drain region being disposed at either side of the second gate structure and being doped with a second dopant of a second type that is opposite the first type.

* * * * *